(12) United States Patent
Feye-Hohmann

(10) Patent No.: US 9,011,171 B2
(45) Date of Patent: Apr. 21, 2015

(54) HOUSING, IN PARTICULAR FOR AN ELECTRICAL CABLE CONNECTION

(75) Inventor: Juergen Feye-Hohmann, Detmold (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 122 days.

(21) Appl. No.: 13/809,916

(22) PCT Filed: Jul. 15, 2011

(86) PCT No.: PCT/EP2011/003579
§ 371 (c)(1),
(2), (4) Date: Jan. 14, 2013

(87) PCT Pub. No.: WO2012/007180
PCT Pub. Date: Jan. 19, 2012

(65) Prior Publication Data
US 2013/0133915 A1   May 30, 2013

(30) Foreign Application Priority Data
Jul. 16, 2010   (DE) .......................... 10 2010 027 524

(51) Int. Cl.
*H01R 13/627* (2006.01)
*H05K 5/00* (2006.01)
*H01R 43/26* (2006.01)

(52) U.S. Cl.
CPC .............. *H05K 5/00* (2013.01); *H01R 13/6273* (2013.01); *H01R 43/26* (2013.01)

(58) Field of Classification Search
CPC ................................ H01R 13/627; H05K 5/00
USPC ............. 439/345, 350, 352, 358, 349; 175/50
See application file for complete search history.

(56) References Cited

U.S. PATENT DOCUMENTS 3,133,777 A  *  5/1964  Anhalt .......................... 439/350
4,200,350 A      4/1980  Zimmerman
(Continued)

FOREIGN PATENT DOCUMENTS

DE           1440918 A1   12/1968
(Continued)

OTHER PUBLICATIONS

English Machine Translation of DE3237093A1.*
European Patent Office, International Search Report in International Patent Application No. PCT/EP2011/003579 (Oct. 25, 2011).

*Primary Examiner* — Timothy Thompson
*Assistant Examiner* — Guillermo Egoavil
(74) *Attorney, Agent, or Firm* — Leydig, Voit & Mayer, Ltd.

(57) ABSTRACT

A housing for an electrical cable connection with two housing parts which can be connected to one another and which each have a connecting portion. A first housing part has a connecting portion which is in the form of an insertion portion, and a second housing part has a connection portion which is in the form of a receiving portion. The receiving portion has an insertion opening. In order to produce the connection, the insertion portion can be inserted into the insertion opening in the second housing part, with the receiving portion radially completely surrounding the insertion portion in the connected state. Latching units are provided on the connecting portions, wherein the latching units may have latching lugs and latching openings which engage one in the other in a positive manner in the connected state. In order to produce the connected state, the receiving portion can be at least partly elastically deformed.

12 Claims, 3 Drawing Sheets

(56) References Cited

U.S. PATENT DOCUMENTS 5,314,347 A * 5/1994 Colleran et al. .............. 439/350
5,620,330 A * 4/1997 Pizon ............................ 439/350
7,349,200 B2 * 3/2008 Hardt et al. .............. 361/679.55
7,695,302 B2 * 4/2010 Eissner et al. ................ 439/352

FOREIGN PATENT DOCUMENTS

| DE | 3237093 A1 * | 4/1984 | ........... H01R 13/639 |
| DE | 19961388 A1 * | 6/2001 | ............... H05K 5/00 |
| EP | 0585633 A1 | 3/1994 | |

* cited by examiner

HOUSING, IN PARTICULAR FOR AN ELECTRICAL CABLE CONNECTION

CROSS REFERENCE TO RELATED APPLICATIONS

This application is a U.S. national phase application under 35 U.S.C. §371 of International Application No. PCT/EP2011/003579, filed on Jul. 15, 2011, and claims benefit to German Patent Application No. DE 10 2010 027 524.7, filed on Jul. 16, 2010. The international application was published in German on Jan. 19, 2012, as WO 2012/007180 A1 under PCT Article 21(2).

The present invention relates to a housing which is particularly suitable for electrical cable connections and which comprises two housing parts which can be connected together. The housing can be used for the most varied types of electrical cable connections. The use of this housing is also possible and preferred in the case of housings for cable connections for photovoltaic installations, to interconnect the solar cables of individual modules of photovoltaic installations via electrical cable connections.

In the prior art, all kinds of housings have become known for electrical cable connections, which housings comprise two or more housing parts and are configured such that they can be connected together, in particular latched together. Latching is an economical possibility of connecting the plastics material parts of a housing, since screws and additional components are not required. The assembly is also straightforward and is also well suited to automated processes.

The use of latching hooks is conventional, a lug being mounted on the end of said hook. Due to parallel offset force action lines, a torque can arise here which, if considerable forces are present, results in an upwards bending of the interlocked surfaces, as a result of which the connection can be automatically released in the case of high forces.

Against this background, the object of the present invention is to provide a housing for electrical cable connections which comprises two interconnectable housing parts, is easy to assemble and does not automatically open again.

This object is achieved by a housing having the features of claim 1. Preferred developments are described in the subclaims. Further advantages and features are provided in the embodiments.

A housing according to the invention is provided, in particular for use on electrical cable connections and comprises at least two interconnectable housing parts. Each housing part has in each case at least one connecting portion, a first housing part having a connecting portion which is configured as an insertion portion. A second housing part has a connecting portion which is configured as a receiving portion. An insertion opening is provided in the receiving portion. To produce the connection of the two housing parts, the insertion portion of the first housing part can be introduced into the insertion opening in the second housing part. In the inserted state, the receiving portion radially completely surrounds the insertion portion. Latching means are provided on the connecting portions, which latching means comprise latching lugs and latching openings which cooperate with one another and, in the connected state, engage positively one inside the other. To produce the connected state, the receiving portion is at least partly elastically deformable.

The housing according to the invention has many advantages. A significant advantage of the housing according to the invention is that the connecting portions, received positively against one another, completely surround one another, thereby producing a self-supporting effect of the insertion portion. The receiving portion surrounding the insertion portion completely surrounds said insertion portion and thus remains dimensionally stable, even when there are high axial forces. In this respect, the receiving portion is hollow and receives the insertion portion in a positive and captive manner, thereby ensuring a fixed, secure connection. In this respect, the receiving portion receives the insertion portion positively in the radial and axial directions, so that the connection cannot be produced or released without an elastic deformation of the receiving portion.

In preferred developments, the latching is without clearance. The latching lugs can be configured as latching hooks, whereas the latching openings can be configured as latching holes or latching recesses. The latching openings completely surround the latching lugs or latching hooks.

The receiving portion preferably comprises a wall which surrounds the insertion portion and consists of a resilient material. The outer wall which surrounds the insertion portion in the connected state completely surrounds the insertion portion radially, whereas the latching means on the inner and outer connecting portions or on the insertion portion and on the receiving portion engage one inside the other in a captive manner in the connected state.

In preferred developments, the receiving portion surrounds the insertion portion concentrically. It is particularly preferred for the receiving portion to surround the insertion portion with a radial spacing. A radial spacing of this type ensures that with elastic deformation, the connection can be easily produced or released.

The insertion portion preferably has a flat circular shape in cross section. For this purpose, the end regions are rounded off in the direction of the maximum extent, whereas lateral regions are flattened. The shape of the end regions is preferably adapted to the inner contour of the receiving portion, so that the insertion portion preferably rests closely against the inner wall of the receiving portion. If the receiving portion is elastically deformed and compressed against the flat regions, the interior of the receiving portion deforms elliptically and the insertion portion can be inserted or removed again.

In preferred configurations, at least one latching lug is provided on the insertion portion and is configured to project outwards. At least one latching opening is provided in the receiving portion. In this respect, in the connected state, the latching lug of the insertion portion cooperates with the latching opening in the receiving portion.

The receiving portion preferably has a roundish or even a round cross section and the insertion portion has a cross-sectional shape which differs from a round cross section. Instead of the round cross section of the receiving portion, a polygonal cross section is particularly also possible and preferred. The cooperation between the roundish cross section of the receiving portion and the cross-sectional shape, differing from a round cross section, of the insertion portion allows the connection to be produced and released in a simple manner.

For this purpose, in a preferred development, the inner circumference of the receiving portion has a greater length than the length of an envelope of the insertion portion, the envelope enclosing at least one latching lug of the insertion portion. If, for example, the receiving portion has a round cross section and the insertion portion has a cross section consisting of a round cross section and latching lugs which project therefrom, then the inner circumference of the circular receiving portion is longer than the circumferential length of an ellipse which encloses the insertion portion with the latching lugs. In this respect, the long axis of the ellipse is oriented through the latching lugs and the short axis of the ellipse extends transversely or even perpendicularly thereto. In a configuration of this type, due to an elastic deformation of the wall of the receiving portion, the cross section of the receiving portion can be adapted to the cross section of the envelope of the insertion portion. Since the length of the elastically deformed inner circumference of the receiving portion is greater than the circumferential length of the envelope of the insertion portion, after the elastic deformation, the insertion portion can be removed from the receiving portion, because the latching action between the latching lugs and the latching openings has ceased.

To insert the insertion portion into the receiving portion, the wall of the receiving portion is elastically deformed again so that the free cross section of the receiving portion is adapted to the cross section of the envelope of the insertion portion. Since the inner circumference of the elastically deformed receiving portion is greater than the length of the envelope of the insertion portion, the insertion portion can thus be introduced into the receiving portion. When the pressure for the elastic deformation of the receiving portion is no longer applied, the elastically deformed receiving portion is deformed back into its original position, the latching lugs of the insertion portion latching into the latching openings in the receiving portion, thereby producing a positive connection of the insertion portion in the receiving portion.

At least two opposing latching lugs and two opposing latching openings are preferably provided.

In a preferred development, a total of a maximum diameter of the insertion portion through the latching lug and of a diameter of an insertion portion transversely thereto is less than double the free diameter of the receiving portion. This means that in this preferred development, the average diameter of the insertion portion is smaller than the diameter of the receiving portion. Particularly in the case of small elastic deformations from the circular shape into an elliptic shape, the circumference of an ellipse corresponds in the first approximation to approximately the circumference of a circle having the average diameter of the ellipse. This means that a circular receiving portion must have a diameter which is slightly greater than the average diameter of an elliptical insertion portion, so that the receiving portion is so elastically deformable that the elliptical insertion portion can be inserted into the receiving portion.

In another configuration, it is also possible for the latching lugs to be provided on the receiving portion, while latching openings are provided in the insertion portion. The receiving portion can then basically have, for example, a circular free cross section, into which the latching lugs project from outside. In turn, the insertion portion can have a correspondingly smaller circular cross section and can have in its outer wall the latching openings for receiving the latching lugs in the connected state. In this respect, the receiving portion has in its normal state a minimum diameter which is smaller than the external diameter of the insertion portion, whereas a maximum diameter of the receiving portion is greater than the maximum external diameter of the insertion portion. An elastic deformation of the receiving portion enlarges the free receiving region between the latching lugs of the receiving portion, so that the insertion portion which is provided, for example with a circular cross section, can be inserted into the receiving portion. When the force for the elastic deformation of the receiving portion is no longer applied, the resiliently configured receiving portion springs back into its original position and the latching lugs of the receiving portion engage in the latching openings in the insertion portion and thus produce a positive and captive connection between the two parts of the housing.

To facilitate the release of the two housing parts from one another, at least one latching lug and/or one latching opening can have a bevel. If the bevel is provided on the latching lug for example, then a rotation of the connecting portions relative to one another in the direction of the bevel results in the receiving portion being deformed elastically and thus the insertion portion can be removed from the receiving portion. If the bevel is provided only on one side of the latching lug or of the latching opening, then an opening action can be produced merely by rotating in one direction, whereas a turning procedure in the other direction merely results in a joint rotation of both parts of the housing.

In all configurations, the insertion portion or the receiving portion can be configured as a housing cover.

In the following, further advantages and features of the invention are described in the embodiments which are portrayed with respect to the following figures, of which:

A first embodiment of the present invention is described with reference to FIGS. 1 to 7 and a further embodiment of the present invention is described with reference to FIG. 8.

Figure 1:
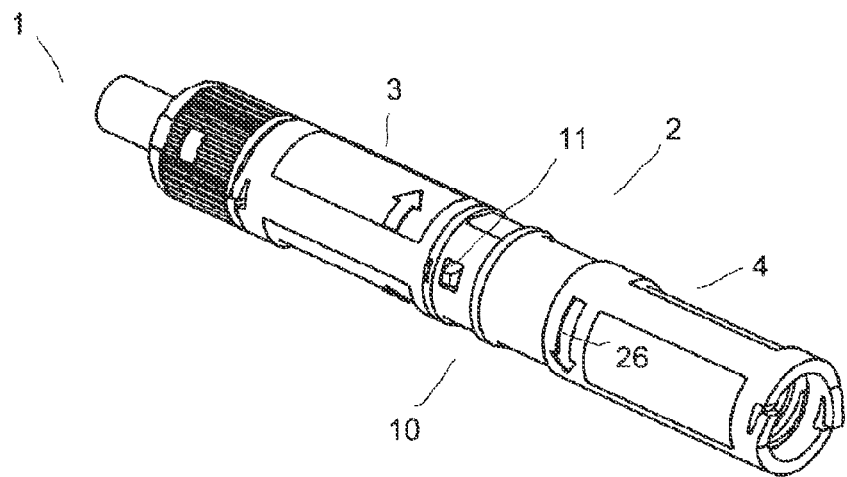
FIG. 1 is a perspective view of the housing in the connected state.

FIG. 1 shows a housing 1 according to the invention in the connected state 10. The housing 1 is used as an electrical cable connection 2 and comprises two housing parts 3 and 4 which, in the illustrated connected state 10, are connected together in a captive and positive manner.

The housing part 3 has latching means 11 in the form of latching lugs 12, whereas the housing part 4 comprises latching means 11 in the form of latching openings 13, which latching means engage positively one in the another in the connected state 10.

Figure 2:
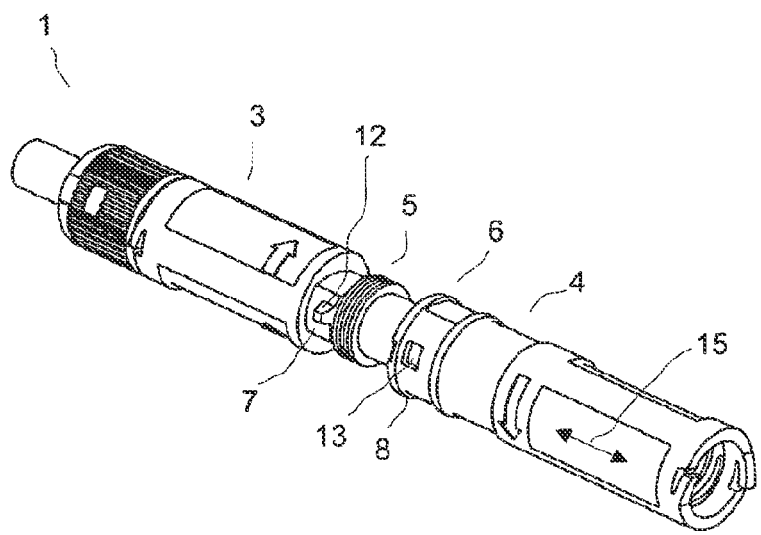
FIG. 2 is a perspective view of the housing during connection of the housing parts.

FIG. 2 is a perspective view of the housing 1 during production of the connected state 10, where connecting portion 5, configured as insertion portion 7, of housing part 3 has not yet been fully introduced into connecting portion 6, configured as receiving portion 8, of housing part 4.

Figure 3:
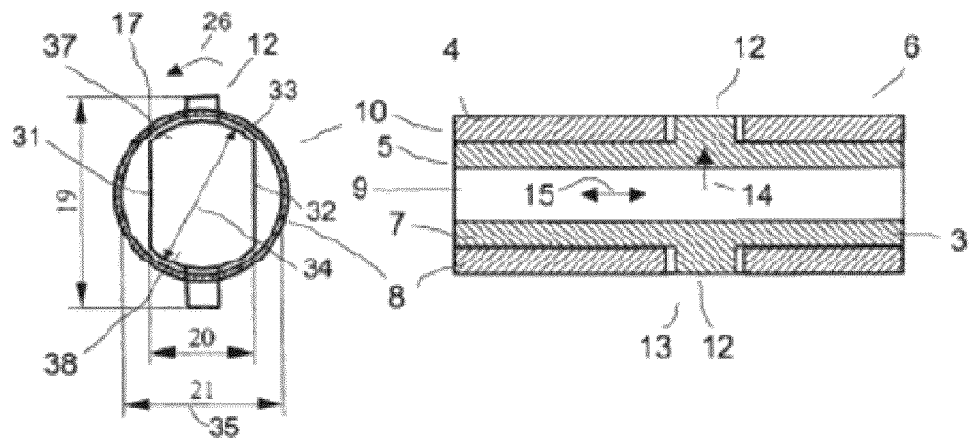
FIG. 3 shows a schematic cross section and a longitudinal section.

FIG. 3 schematically shows a cross section and a longitudinal section through the housing 1 with the housing parts 3 and 4 in the connected state 10. The schematic longitudinal section shown further to the right in FIG. 3 shows the insertion portion 7 of the housing part 3 which has been received in the insertion opening 9 in the receiving portion 8 of the second housing part 4. In this respect, the latching lugs 12, which project radially outwards from the insertion opening 7, engage in corresponding latching openings 13 in the receiving portion 8 and are held therein in a positive and captive manner. The outer connecting portion 6 or the receiving portion 8 completely surrounds the inner connecting portion 5 or the insertion portion 7 in the radial direction, so that the latching lugs 12 are received positively and captively in the circumferential direction 26, in the axial direction 15 and also in the radial direction 14.

A radial spacing can be provided between the external diameter of the insertion portion 7 and the free internal diameter of the receiving portion 8 at the sides having the flat regions 31 and 32, which radial spacing ensures a straightforward assembly and disassembly of the housing 1 in conjunction with the elastic deformability of the receiving portion 8.

In this respect, the dimensions of the insertion portion 7 and of the receiving portion 8 are calculated such that the insertion cross section, configured here to be substantially round and having opposing flat regions 31 and 32, has with its external diameter 34 an identical or a slightly smaller diameter than the free internal diameter 21 of the receiving portion 8. In this case, the free internal diameter 21 corresponds to the round internal diameter 35. However, the maximum external diameter 19 of the insertion portion 7 through the latching lugs 12 is greater than the free internal diameter 21 of the receiving portion 8. The insertion portion 7 rests with the rounded end regions 37 and 38 from inside closely or with only a very small clearance against the inner circumference 17 of the receiving portion 8. The radius 33 of the end regions 37 and 38 corresponds to the radius of the receiving portion 8 which is configured cylindrically in the connected state.

The fact that the latching lugs 12 of the insertion portion 7 project radially outwards through the latching openings 13 in the receiving portion 8 means that the insertion portion 7 and thus the housing part 3 is received positively and captively on the housing part 4.

Figure 4:
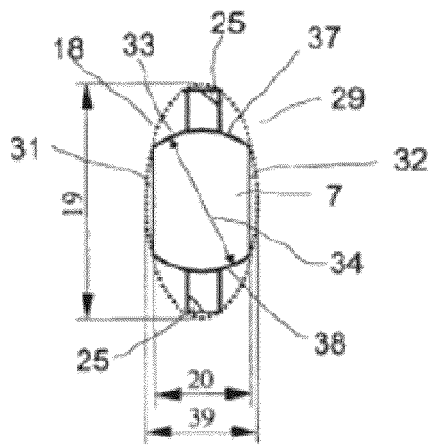
FIG. 4 is a schematic view of the insertion portion.

FIG. 4 schematically shows the insertion portion 7, on the periphery of which the latching lugs 12 project radially outwards. The outer periphery of the insertion portion 7 can be described in a simplified manner by an envelope 29 which is shown here as an ellipse and has a maximum diameter 19 and a minimum diameter 39. If appropriate, the minimum diameter 39 can correspond to the diameter 20 on the flat regions 31, 32, although it has been shown to be slightly greater in FIG. 4. Bevels 25 on the latching lugs 12 can allow an opening procedure without using a tool.

Figure 5:
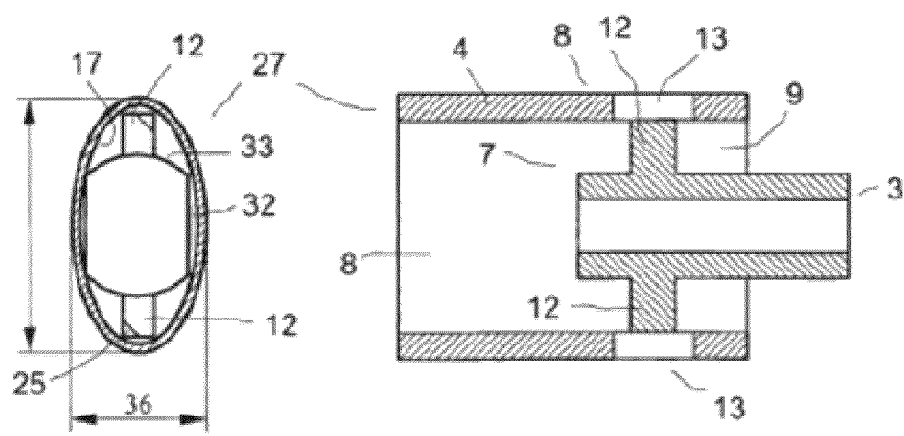
FIG. 5 shows a schematic cross section and a longitudinal section during connection of the two housing parts.

FIG. 5 shows the opening state 27 during production or re-opening of the connection of the two housing parts 3 and 4, when for example a tool (not shown here) compresses the receiving portion. It can be seen that the inner circumference 17 of the receiving portion 8 has the same or a slightly greater inner circumferential length than the circumferential length of the envelope 29 of the insertion portion 7. Consequently, due to an elastic deformation of the receiving portion 8 into an elliptical shape, as shown in FIG. 5, the latching of the latching lugs 12 in the latching openings 13 can be cancelled out, so that the insertion portion 7 can be removed from the receiving portion 8, as a result of which the two parts 3 and 4 of the housing 1 are separated again from one another.

Shown in the right-hand part of FIG. 5 is a longitudinal section which illustrates that the latching lugs 12 in this elastic deformation state or opening state 27 are arranged completely inside the free cross section of the receiving portion 8, thereby allowing the connecting portion 7 to be removed axially.

Figure 6:
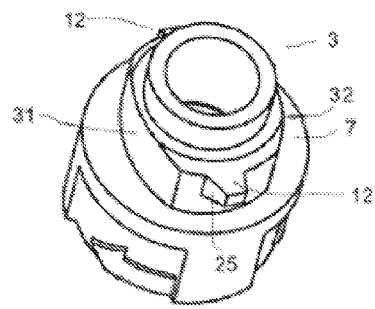
FIG. 6 is a perspective view of the insertion portion.

FIG. 6 shows an enlarged perspective view of the insertion portion 7, where two latching lugs 12 project radially outwards in opposing areas. Arranged on one side of the latching lugs 12 is a respective bevel 25 which, in the connected state 10, results in the receiving portion 8 opening automatically when the insertion portion 7 is rotated in the direction of the bevels, because, due to the bevel 25, the receiving portion deforms elastically and thus results in an easy separation of the two housing parts. Provided on the sides are the flat regions 31 and 32 which allow an elastic deformation of the receiving portion 8 when the insertion portion 7 has been received without clearance or with little clearance on the receiving portion 8. In this respect, the shape of the flat regions 31 and 32 and the height of the latching lugs 12 are adapted.

Figure 7:
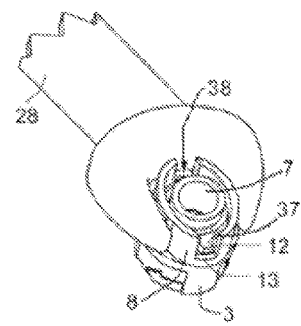
FIG. 7 shows the use of a tool during connection of the housing parts.

FIG. 7 illustrates a typical possibility of assembling a housing of this type using a tool 28 which is configured, for example, as a spanner or pipe wrench or the like. The receiving portion 8 is elastically deformed, as a result of which the insertion portion can be introduced into the free cross section of the receiving portion. After the tool 28 has been removed from the receiving portion 8, the elastic deformation of the receiving portion 8 reforms and the receiving portion 8 re-assumes its original cross-sectional shape which is round in this case. In this respect, the latching lugs 12 of the insertion portion 7 pass through the latching openings 13 in the receiving portion 8 and fix housing part 3 on housing part 4 in the axial direction and also in the circumferential direction. At the same time, the end regions 37 and 38 of the insertion portion rest closely against corresponding rounded regions in the receiving portion.

In this case, the receiving region of the receiving portion 8 is cylindrical with an internal diameter 23.

Figure 8:
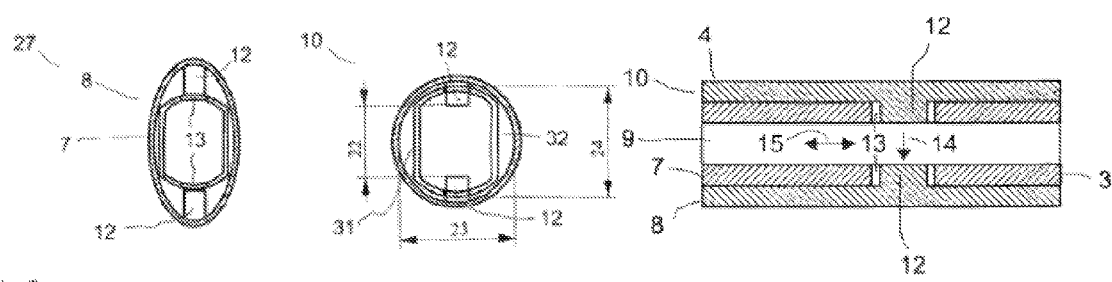
FIG. 8 shows a further embodiment of a housing according to the invention.

FIG. 8 shows schematic views of an alternative configuration of a housing 1, and here the latching lugs 12 are provided on the receiving portion 8 and project radially inwards thereon. The latching openings 13 are provided in the insertion portion 7 and serve to receive the latching lugs 12 in the connected state 10.

In the connected state, the receiving portion 8 surrounds the insertion portion 7 in a substantially concentric manner. The free internal diameter 22 between the latching lugs 12 is smaller in the connected state 10 than the external diameter 24 of the insertion portion 7. On the other hand, in the elastically deformed opening state 27, the free spacing between the ends of the latching lugs 12 is great enough for the insertion portion 7 to be able to be removed from the receiving portion 8, and thus for the two housing parts 3 and 4 to be able to be separated from one another.

Overall, the invention provides a housing 1 which can be easily assembled and disassembled and which allows a secure connection of the two housing parts even in the case of high tensile forces. The fact that at least one housing part has to be resiliently transformed from a round shape into a non-round shape to produce and to release the connection means that a secure, yet easily mountable solution can be provided.

In preferred configurations, the latching zone of one housing part is formed geometrically such that everything is included by an imaginary ellipse, the circumference of which is slightly smaller than the circumference of the inner circle of the outer housing part or of the receiving portion. Deforming the outer housing part from a circular shape into an oval means that the latching lugs can be introduced and thus the connection can be produced or the latching lugs can be removed again and thus the connection can be released again.

LIST OF REFERENCE NUMERALS

Housing 1
Cable connection 2
Housing part 3
Housing part 4
Connecting portion 5
Connecting portion 6
Insertion portion 7
Receiving portion 8
Insertion opening 9
Connected state 10
Latching means 11

Latching lug 12
Latching opening 13
Radial direction 14
Axial direction 15
Radial spacing 16
Inner circumference 17
Length 18
Maximum diameter 19
Diameter 20
Free diameter 21
Minimum free diameter 22
Free diameter 23
Diameter 24
Bevel 25
Circumferential direction 26
Opening state 27
Tool 28
Envelope 29
Flat regions 31, 32
Radius 33
External diameter 34
Internal diameter 35
Transverse diameter 36
End regions 37, 38

The invention claimed is:

1. A housing, in particular for an electrical cable connection, comprising two housing parts which can be connected together and which each have a connecting portion, a first housing part comprising a connecting portion configured as an insertion portion, the insertion portion having a cross-sectional shape which differs from a circular cross section, and a second housing part comprising a connecting portion configured as a receiving portion, the receiving portion having an insertion opening and having a circular cross-section, and to produce the connection, the insertion portion can be introduced into the insertion opening in the second housing part where the receiving portion radially completely surrounds the insertion portion in a connected state, wherein the connecting portions include a latching mechanism which comprises latching lugs and latching openings which engage with one another positively in the connected state, and in that to produce the connected state, the receiving portion is at least partly elastically deformable.

2. The housing of claim 1, wherein the receiving portion comprises a wall which surrounds the insertion portion and consists of a resilient material.

3. The housing of claim 1, wherein the receiving portion concentrically surrounds the insertion portion.

4. The housing of claim 1, wherein the receiving portion rests against the insertion portion at least in portions with a small clearance and in particular without any clearance.

5. The housing of claim 1, wherein the at least one latching lug is provided on the insertion portion and is configured to project outwards and the at least one latching opening is provided in the receiving portion.

6. The housing of claim 1, wherein an inner circumference of the receiving portion has a length which is in particular at least as long as the envelope of the insertion portion with the at least one latching lug.

7. The housing of claim 1, wherein at least two opposing latching lugs and at least two opposing latching openings are provided.

8. The housing of claim 1, wherein a total of a maximum diameter over the latching lug of the insertion portion and of a diameter of the insertion portion transversely thereto is less than double the free internal diameter of the receiving portion.

9. The housing of claim 1, wherein a total of a minimum free internal diameter of the receiving portion and of a free internal diameter of the receiving portion transversely thereto is greater than double the diameter of the insertion portion.

10. The housing of claim 1, wherein at least one latching lug has a bevel.

11. The housing of claim 1, wherein at least one latching opening is provided in the insertion portion and at least one inwardly projecting latching lug is provided on the receiving portion.

12. The housing of claim 1, wherein the insertion portion or the receiving portion is configured as a housing cover.

\* \* \* \* \*